United States Patent
Sonderman et al.

(10) Patent No.: US 6,387,823 B1
(45) Date of Patent: May 14, 2002

(54) METHOD AND APPARATUS FOR CONTROLLING DEPOSITION PROCESS USING RESIDUAL GAS ANALYSIS

(75) Inventors: Thomas Sonderman; Anthony J. Toprac, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/577,756

(22) Filed: May 23, 2000

(51) Int. Cl.[7] ............................................. C13C 16/00
(52) U.S. Cl. ...................... 438/758; 438/680; 438/774; 438/775; 438/784; 427/8; 427/9
(58) Field of Search ................. 430/758, 774, 430/775, 784, 680; 427/8, 9

(56) References Cited

U.S. PATENT DOCUMENTS

| | | | | |
|---|---|---|---|---|
| 5,273,423 A | * | 12/1993 | Shiraiwa | 432/241 |
| 5,712,702 A | * | 1/1998 | McGahay et al. | 356/311 |
| 5,897,710 A | * | 4/1999 | Sato et al. | 427/8 |
| 6,264,706 B1 | * | 7/2001 | Hirano | 29/25.01 |

\* cited by examiner

*Primary Examiner*—Charles Bowers
*Assistant Examiner*—Lisa Kilday
(74) *Attorney, Agent, or Firm*—Williams, Morgan & Amerson, P.C.

(57) ABSTRACT

A method for controlling a deposition process, includes providing a wafer in a chamber of a deposition tool, the deposition tool being adapted to operate in accordance with a recipe; providing reactant gases to the chamber, the reactant gases reacting to form a layer on the wafer; allowing exhaust gases to exit the chamber; measuring characteristics of exhaust gases; and changing the recipe based on the characteristics of the exhaust gases. A deposition tool includes a chamber, a gas supply line, a gas exhaust line, a gas analyzer, and a controller. The chamber is adapted to receive a wafer. The gas supply line is coupled to the chamber for providing reactive gases. The gas exhaust line is coupled to the chamber for receiving exhaust gases. The gas analyzer is coupled to the gas exhaust line and adapted to determine characteristics of the exhaust gases. The controller is adapted to control the processing of the wafer in the chamber based on the characteristics of the exhaust gases.

13 Claims, 4 Drawing Sheets

METHOD AND APPARATUS FOR CONTROLLING DEPOSITION PROCESS USING RESIDUAL GAS ANALYSIS

BACKGROUND OF THE INVENTION

1. Field of the Invention

This invention relates generally to semiconductor device manufacturing, and, more particularly, to a method and apparatus for controlling a deposition process using residual gas analysis.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process used to form the layers is known as chemical vapor deposition (CVD), wherein reactive gases are introduced into a vessel, e.g., a CVD tool, containing the semiconductor wafers. The reactive gases facilitate a chemical reaction that causes a layer to form on the wafers. One exemplary deposition process is the formation of polysilicon in a furnace by reacting nitrogen ($N_2$) and silane ($SiH_4$) in a furnace.

There are many factors that affect the deposition rate of a deposition tool. These factors include, among other things, the flow rate of reactive gases through the chamber and the temperature of the chamber. Typically, to determine the deposition rate for a particular tool (e.g., when it is first placed in service or after a maintenance event), a series of qualification wafers are processed and the resultant thickness of the process layer is measured. The measurements are used to estimate the deposition rate of the tool. Deposition times for subsequently processed wafers are determined based on the anticipated deposition rate. Normal variations in temperature and reactant flow rate may cause a deviation in the deposition rate from the anticipated rate, causing the process to exceed a control limit. Statistical processing is typically conducted on a sample of wafers in each lot to determine if the deposition process yielded a process layer thickness within an acceptable range. In some cases, the post-process metrology data is not available prior to processing another lot of wafers in the tool. A deviation out of the acceptable range might not be detected in time, resulting in two lots out of specification. Thickness variations can result in reduced equipment utilization and availability. Also, the thickness variations must be accounted for in subsequent processing steps. Generally, a greater process variation results in a more costly and less efficient processing system. Post-process sampling provides some measure of process performance, but not at a level suitable for lot-by-lot process control in a high-volume production facility.

The present invention is directed to overcoming, or at least reducing the effects of, one or more of the problems set forth above.

SUMMARY OF THE INVENTION

One aspect of the present invention is seen in a method for controlling a deposition process. The method includes providing a wafer in a chamber of a deposition tool, the deposition tool being adapted to operate in accordance with a recipe; providing reactant gases to the chamber, the reactant gases reacting to form a layer on the wafer; allowing exhaust gases to exit the chamber; measuring characteristics of exhaust gases; and changing the recipe based on the characteristics of the exhaust gases.

Another aspect of the present invention is seen in a deposition tool including a chamber, a gas supply line, a gas exhaust line, a gas analyzer, and a controller. The chamber is adapted to receive a wafer. The gas supply line is coupled to the chamber for providing reactive gases. The gas exhaust line is coupled to the chamber for receiving exhaust gases. The gas analyzer is coupled to the gas exhaust line and adapted to determine characteristics of the exhaust gases. The controller is adapted to control the processing of the wafer in the chamber based on the characteristics of the exhaust gases.

BRIEF DESCRIPTION OF THE DRAWINGS

The invention may be understood by reference to the following description taken in conjunction with the accompanying drawings, in which like reference numerals identify like elements, and in which.

Figure 1:
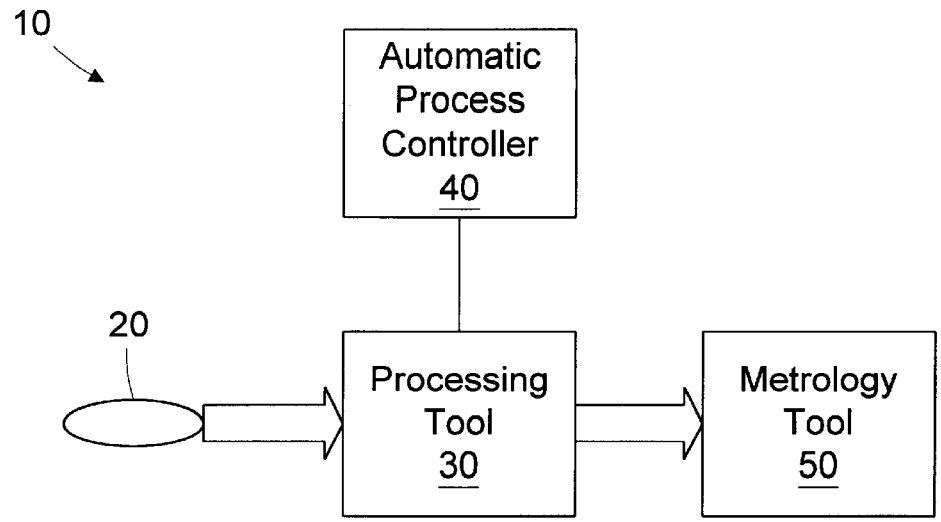
FIG. 1 is a simplified block diagram of a processing line in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring first to FIG. 1, a simplified diagram of an illustrative processing line 10 for processing wafers 20 in accordance with the present invention is provided. The processing line 10 includes a deposition tool 30, an automatic process controller 40, and a metrology tool 50. The automatic process controller 40 interfaces with the deposition tool 30 for modifying operating parameters of the deposition tool 30 based on a model of the deposition rate for the deposition tool 30. The model of the deposition rate is based on an analysis of residual gases exiting the deposition tool 30. The metrology tool 50 may be used to provide feedback to the automatic process controller 40 for updating the model so that the model accurately predicts the metrology tool 50 measurements based on the inputs of the residual gas concentration measurements. In the illustrated embodiment, the deposition tool 30 is a CVD chamber useful for depositing a polysilicon layer on the semiconductor wafers 20. Reactive gases, including nitrogen ($N_2$) and silane ($SiH_4$), are provided to the deposition tool 30 to facilitate the polysilicon formation. A suitable deposition tool 30 is a TEL vertical furnace. Although the invention is described as it may be implemented in a polysilicon deposition furnace, the concepts described herein may be applied to various other deposition tools used for forming a variety of process layers, such as silicon oxide, silicon nitride, silicon oxy nitride, oxygenated polysilicon, titanium nitride, and doped silicon glasses such as boron-phosphorous-silicon-glass (BPSG).

The automatic process controller 40 contains a model of the deposition rate of the deposition tool 30 based on an analysis of residual gases exiting the deposition tool 30. The model may be generated and/or updated based on input from the metrology tool 50 of the actual thickness of the deposited layer. An exemplary metrology tool 50 suitable for measuring the thickness of the layer is an Optiprobe tool offered by Thermawave.

In the illustrated embodiment, the automatic process controller 40 is a computer programmed with software to implement the functions described. However, as will be appreciated by those of ordinary skill in the art, a hardware controller designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the automatic process controller 40 described is the Catalyst system offered by KLA-Tencor Corporation. The KLA-Tencor Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Figure 2:
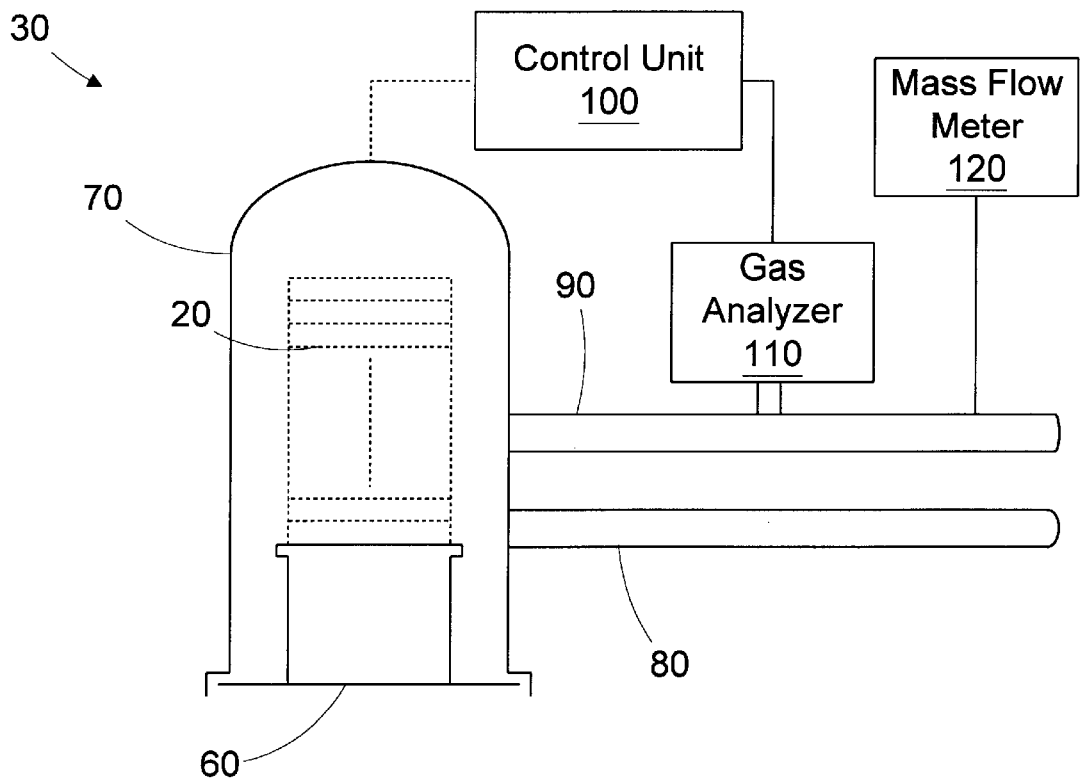
FIG. 2 is a simplified diagram of the deposition tool of FIG. 1.

Referring now to FIG. 2, a simplified diagram of the deposition tool 30 is provided. A lot of wafers 20 are housed in a carrier 60. The carrier 60 is inserted into a processing chamber 70. A gas supply line 80 provides the reactive gases to the chamber 70, and a gas exhaust line 90 receives the exhaust gases. Of course, there may be more than one gas supply line 80 and one gas exhaust line 90. A control unit 100 controls the operation of the deposition tool 30 in accordance with a predetermined recipe. A gas analyzer 110 monitors the exhaust gases to identify residual gas concentrations useful for monitoring the deposition process. An illustrative gas analyzer 110 suitable for use with the present invention is the PORR Residual Gas Analyzer model number HPQ-2, sold by Spectra International.

In the illustrated embodiment, where polysilicon is the process layer material, the exhaust gases are nitrogen and hydrogen. The gas analyzer 110 measures the hydrogen, nitrogen, and unconverted silane concentrations. The measurements from the gas analyzer 110 are sent to the automatic process controller 40 for additional processing. In some cases, it may be necessary or beneficial to measure the mass flow rate of the exhaust gases using a mass flow meter 120 and send these measurements to the automatic process controller 40.

The automatic process controller 40 uses the measurements from the gas analyzer 110 as inputs to a deposition process model for the deposition tool 30. In one embodiment, the automatic process controller 40 performs an integration, or summation in the case of discrete variables, based on the measurements to calculate the amount of silicon deposited in the deposition tool 30. For example, knowing the flow rate of the gases and their concentrations, the mass of the silicon deposited in the chamber 70 can be calculated. Not all of the silicon consumed in the deposition tool 30 deposits on the wafers 20. A percentage, roughly equal to the ratio of the relative surface areas, deposits on the internal surfaces of the chamber 70 and the exposed surfaces of the carrier 60. This factor could be used as a constant in conjunction with the deposition rate to determine the amount of silicon deposited on the wafers 20, or alternatively, the model could be designed to account for this factor. In another embodiment, the measurements are used as direct inputs to the deposition process model, and a deposition rate or deposition time is predicted. The automatic process controller 40 uses the deposition rate or time predictions to evaluate the performance of the deposition tool 30. Based on the output of the model, the automatic process controller 40 can adjust the current process (i.e., endpoint determination), or update the operating recipe of the deposition tool 30 for the next production run (i.e., run-to-run feedback process control). The gas analyzer 110 is capable of providing measurements on the order of every 10 to 20 seconds. A typical run in the deposition tool 30 lasts from tens of minutes to hours. Accordingly, the data from the gas analyzer 110 can be analyzed in sufficient time to provide an endpoint determination.

Figure 3:
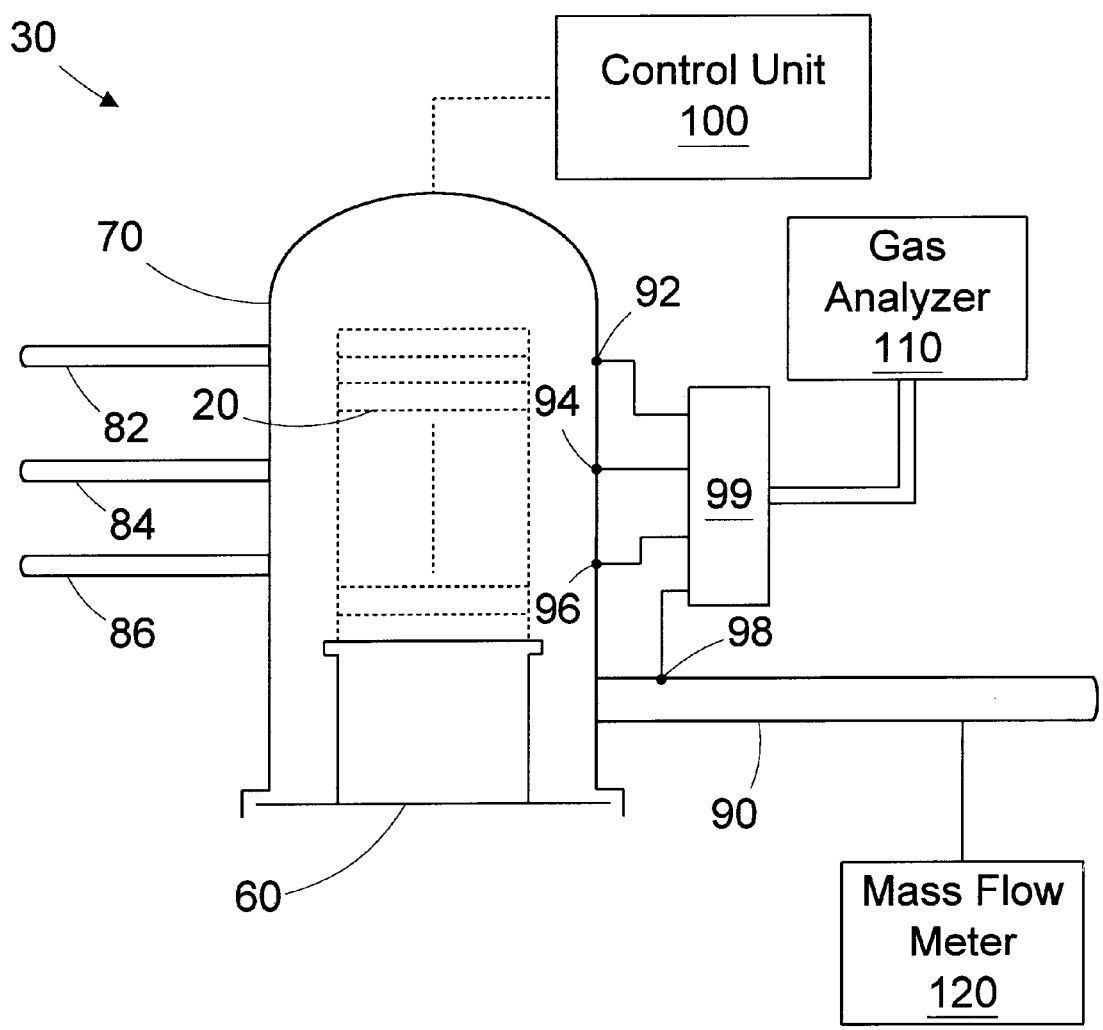
FIG. 3 is a simplified diagram of an alternative embodiment of the deposition tool of FIG. 1.

Referring to FIG. 3, a second embodiment of the deposition tool 30 is illustrated. The deposition tool 30 of FIG. 3 includes multiple injection points 82, 84, 86 for the reactant gases to enter the chamber 70. The gas supply lines 82, 84, 86 provide the reactive gases at discrete points along the wafer load in chamber 70, and the gas exhaust line 90 receives the exhaust gases. There are multiple sample ports 92, 94, 96 provided in the chamber 70 and a sample port 98 provided in the exhaust line 90. The sample ports 92, 94, 96, 98 are coupled to a multiplexing valve array 99 to allow sequential sampling.

The deposition process model is configured to predict the load average post-process thickness of the deposited process layer. In addition, the gas composition measurements in the vicinity of the injection points 84, 84, 86 are used as inputs to the model for predicting the local deposition rates near the injection points. The mass flow rate of reactant gas to each of the injection points that results in the most uniform deposition across the load of wafers and achieves the load average target thickness is calculated by the automatic process controller 40 and used to update the operating recipe of the processing tool 30. The recipe may be updated either in real time or for the next load of wafers processed in the processing tool 30.

The performance model may be generated by the automatic process controller 40, or alternatively, the model may be generated by a different processing resource (not shown) and stored on the automatic process controller 40 after being developed. The model may be developed using the process tool 30 or on a different tool (not shown) having similar operating characteristics. For purposes of illustration, it is assumed that the deposition process model is generated and updated by the automatic process controller 40 based on actual performance of the deposition tool 30 as measured by the metrology tool 50 and the gas analyzer 10. The deposition process model is trained based on historical data collected from numerous processing runs of the deposition tool 30. Various modeling techniques, well known to those of ordinary skill in the art, are suitable. Exemplary modeling techniques include neural network modeling, principal component analysis (PCA), projection to latent structures (PLS), statistical response surface models (RSM), and first-principle physics and chemistry-based models.

The following example is provided as a high-level illustration of how a model of the deposition tool 30 may be generated. The specific implementation of the model may vary depending on the modeling technique selected, and such specific implementation is well known to those of ordinary skill in the art. Thus, for clarity and ease of illustration, such specific details are not described in greater detail herein.

Figure 4:
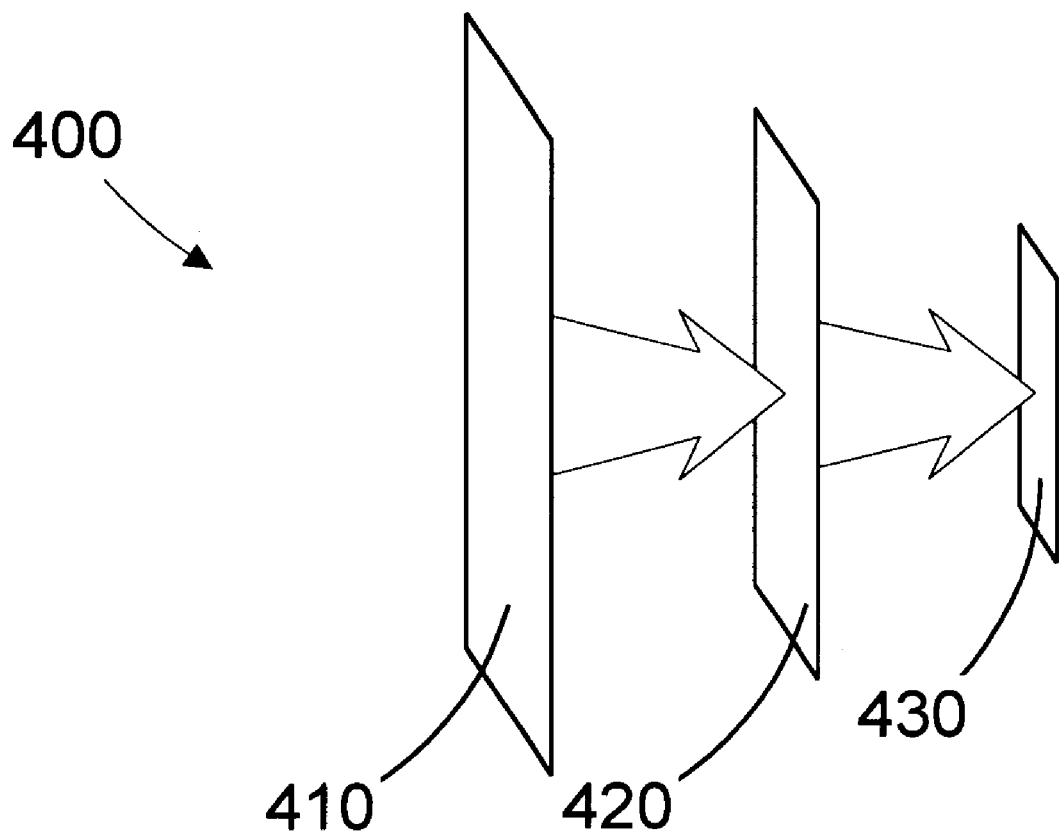
FIG. 4 is a simplified diagram of a neural network modeling system in accordance with one embodiment of the present invention.

Turning briefly to FIG. 4, a simplified diagram of a neural network 400 is provided. The neural network 400 includes an input layer 410, a hidden layer 420, and an output layer 430. The input layer 410 receives those input values deemed appropriate for modeling the performance of the deposition tool 30. In the illustrated embodiment, variables such as the hydrogen concentration, nitrogen concentration, and the gas flow rate are received as inputs, although other inputs may also be used. For example, the mass of the deposited silicon may be calculated and supplied to the model. The hidden layer 420 "learns" the interactions between the various inputs through a training procedure by which the neural network 400 is exposed to historical performance data of the deposition tool 30 or a similar deposition tool (not shown). The hidden layer 420 weights each of the inputs and/or combinations of the inputs to predict some future performance. Through analysis of historical data, the weighting values are changed to try to increase the success at which the model predicts the future performance. The output layer 430 distills the manipulation of the hidden layer 420 to generate a prediction of, for example, the deposition time required to form the process layer at the target thickness.

Once the model is sufficiently trained, it may be used in a production environment to predict the operation of deposition tool 30 based on current input value measurements. Based on the results predicted by the neural network 400, the deposition control parameters are predicted and the operating recipe of the deposition tool 30 is modified accordingly. In the production environment, periodic measurement from the metrology tool 50 are provided as feedback to the automatic process controller 40 for updating the deposition process model.

Figure 5:
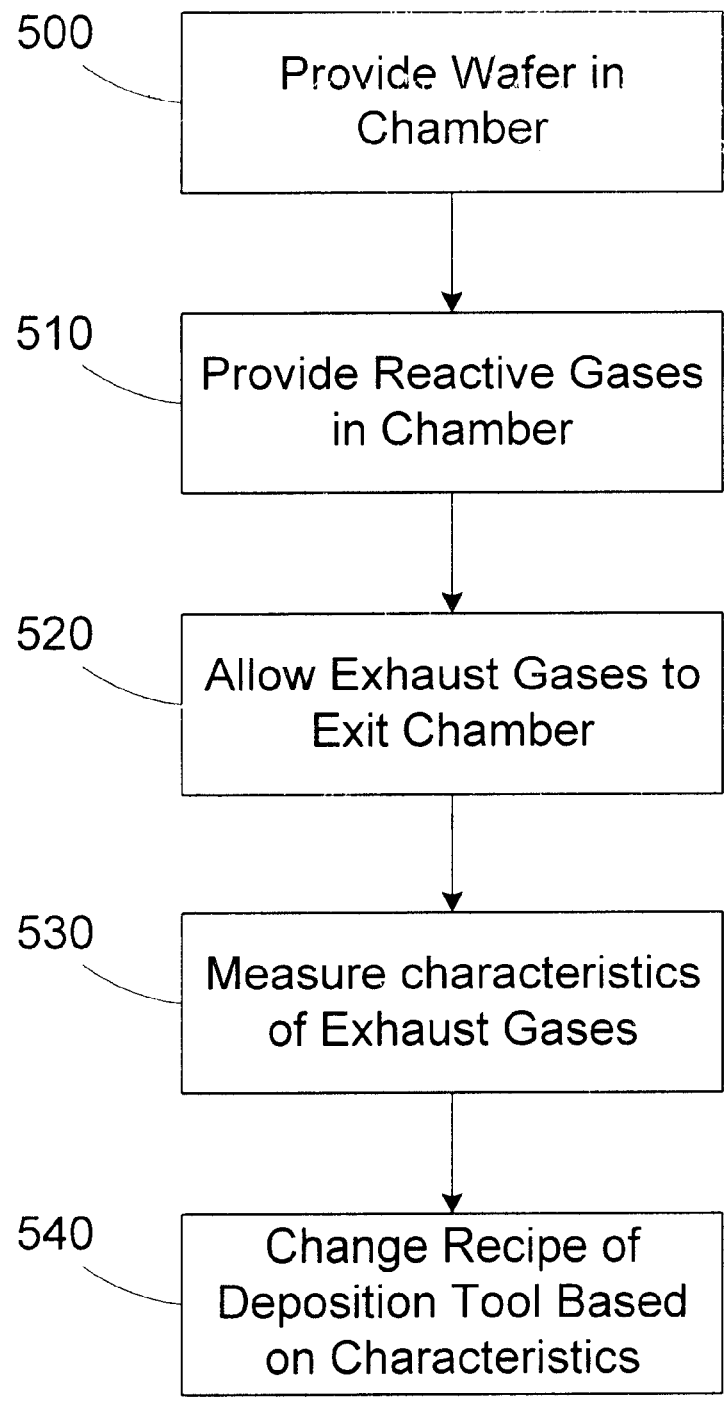
FIG. 5 is a flow diagram of a method for controlling a deposition process using residual gas analysis in accordance with one aspect of the present invention.

Referring now to FIG. 5, a flow diagram of a method for controlling a deposition process using residual gas analysis is provided. In block 500, the wafer 20 is provided in the chamber 70 of the deposition tool 30. The deposition tool 30 is adapted to operate in accordance with a recipe. In block 510, reactant gases are provided to the chamber 70. The reactant gases react to form a layer on the wafer 20. Exhaust gases are allowed to exit the chamber in block 520. In block 530, characteristics of exhaust gases are measured. In block 540, the recipe is changed based on the characteristics of the exhaust gases. Illustrative examples of changes to the recipe based on this technique include, but are not limited to, changing the duration of the process, the gas flow rates, the temperature, etc.

Using residual gas analysis to control the deposition process as described above has numerous advantages. First, the amount of process layer thickness deviation in the wafers 20 is reduced. Also, the control of the process may be conducted in pseudo real time. The residual gas analysis yields an average deposition rate for the entire lot, as opposed to the small sample provided by post-process metrology. Information from the automatic process controller 40 may also be used to diagnose problems with the processing tool 30. A problem with the processing tool 30 may be identified if the deposition rate or time predicted by the model do not correspond to expected values. Also, if post-process metrology data indicates a deviation from the predicted performance, a problem with the deposition tool 30 may be present. If the performance model is accurate, the need for post-process metrology may be reduced or eliminated. Also, fewer test wafers may be required to qualify the deposition tool 30. Reducing the amount of post-process metrology and/or the number of test wafers increases the utilization and availability of the deposition tool 30.

Another advantage of using the residual gas analysis determine endpoints for the deposition process is that the throughput of the deposition tool 30 can be optimized. Past techniques involve selecting a deposition time based on the expected deposition rate of the deposition tool 30. The deposition time was generally predetermined by the other parameters. Using residual gas analysis endpoint determination, the operating variables of the deposition tool 30 may be controlled to achieve a target deposition time or maximum deposition rate. For example, the automatic process controller 40, based on the residual gas measurements and deposition rate predictions from the model, may change the temperature or gas flow rate in the processing tool 30 until a maximum predicted deposition rate is achieved. By driving the process to the maximum allowable deposition rate, the deposition time can be minimized. Such a throughput optimization can increase the efficiency of the deposition tool 30 as well as the efficiency of the entire processing line.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling a deposition process, comprising:

providing a wafer in a chamber of a deposition tool, the deposition tool being adapted to operate in accordance with a recipe;

providing reactant gases to the chamber, the reactant gases reacting to form a layer on the wafer;

allowing exhaust gases to exit the chamber;

measuring characteristics of exhaust gases; and changing the recipe based on the characteristics of the exhaust gases.

2. The method of claim 1, wherein changing the recipe includes changing a deposition time for a subsequent wafer processed in the deposition tool.

3. The method of claim 1, wherein changing the recipe includes changing a flow rate of the reactant gases.

4. The method of claim 1, wherein changing the recipe includes:

determining an endpoint based on the characteristics of the exhaust gases; and removing the wafer from the chamber in response to determining the endpoint.

5. The method of claim 1, further comprising determining a deposition rate based on the characteristics of exhaust gases.

6. The method of claim 5, wherein changing the recipe includes changing the recipe based on the deposition rate.

7. The method of claim 1, further comprising applying a performance model for the deposition tool to the characteristics of the exhaust gases.

8. The method of claim 7, further comprising measuring the thickness of the layer formed on the wafer.

9. The method of claim 8, further comprising updating the performance model based on the measured thickness of the layer.

10. The method of claim 5, further comprising changing the recipe to increase the deposition rate until a target deposition rate is achieved.

11. The method of claim 10, wherein changing the recipe includes changing at least one of a temperature of the chamber or a flow rate of the reactive gases.

12. The method of claim 1, wherein providing the reactive gases comprises providing nitrogen and silane.

13. The method of claim 1, wherein measuring the characteristics of the exhaust gases comprises measuring at least one of a hydrogen concentration, a nitrogen concentration, a silane concentration, and a gas flow rate of the exhaust gases.

* * * * *